(12) United States Patent
Kang et al.

(10) Patent No.: US 10,395,749 B2
(45) Date of Patent: Aug. 27, 2019

(54) METHOD AND APPARATUS FOR REPAIRING MEMORY DEVICE

(71) Applicants: SK hynix Inc., Icheon (KR); INDUSTRY-ACADEMIC COOPERATION FOUNDATION YONSEI UNIVERSITY, Seoul (KR)

(72) Inventors: Sung Ho Kang, Seoul (KR); Joo Young Kim, Seoul (KR); Kee Won Cho, Seoul (KR); Ha Young Lee, Seoul (KR); Sang Doo Kim, Seongnam (KR); Hongshin Jun, Seongnam (KR); Woong Hee Kim, Seoul (KR)

(73) Assignees: SK HYNIX INC., Icheon (KR); INDUSTRY-ACADEMIC COOPERATION FOUNDATION YONSEI UNIVERSITY, Seoul (KR)

( * ) Notice: Subject to any disclaimer, the term of this patent is extended or adjusted under 35 U.S.C. 154(b) by 161 days.

(21) Appl. No.: 15/699,854

(22) Filed: Sep. 8, 2017

(65) Prior Publication Data
US 2018/0182467 A1    Jun. 28, 2018

(30) Foreign Application Priority Data
Dec. 26, 2016  (KR) .................. 10-2016-0179308

(51) Int. Cl.
*G11C 29/00* (2006.01)
*G11C 29/44* (2006.01)

(52) U.S. Cl.
CPC .......... *G11C 29/44* (2013.01); *G11C 29/4401* (2013.01); *G11C 29/72* (2013.01); *G11C 29/80* (2013.01); *G11C 29/838* (2013.01); *G11C 2029/4402* (2013.01)

(58) Field of Classification Search
CPC ... G11C 29/4401; G11C 29/44; G11C 29/838; G11C 29/72; G11C 29/80; G11C 2029/4402; G11C 29/808; G11C 29/783; G11C 29/83; G11C 7/1048; G11C 29/846; G11C 29/785; G11C 2207/002; G11C 29/34; G11C 11/401; G11C 29/76; G11C 11/1653; G11C 29/84; G11C 7/20; G11C 29/789; G11C 29/82; G06F 12/0238; G06F 2212/7207; G06F 2212/7209
See application file for complete search history.

(56) References Cited

FOREIGN PATENT DOCUMENTS

| KR | 10-1269557 B1 | 6/2013 |
| KR | 10-1521258 B1 | 5/2015 |
| KR | 10-2015-0136738 A | 12/2015 |

OTHER PUBLICATIONS

John R. Day, "A Fault-Driven, Comprehensive Redundancy Algorithm", IEEE Design & Test of Compute, Jun. 1985, pp. 35-44, vol. 2, Iss. 3, IEEE, <http://ieeexplore.ieee.org/document/4069585/?reload=true>.

(Continued)

*Primary Examiner* — Guerrier Merant

(57) ABSTRACT

A method of repairing a memory device may include collecting fail information on fail cells in a multi-block memory, classifying the fail cells into first and second types, and repairing the fail cells in the multi-block memory using one or more of a global spare memory, a local spare memory, and a common spare memory, based on the fail information.

15 Claims, 3 Drawing Sheets

(56) References Cited

OTHER PUBLICATIONS

Sy-Yen Kuo, "Efficient Spare Allocation for Reconfigurable Arrays", University of Illinois, IEEE Design & Test of Compute, Feb. 1987, pp. 24-31, vol. 4, Iss. 1, IEEE, <http://ieeexplore.ieee.org/abstract/document/4069930/>.

Woosik Jeong et al., "An Advanced BIRA for Memories With an Optimal Repair Rate and Fast Analysis Speed by Using a Branch Analyzer", IEEE Transactions on Computer, Dec. 2010, pp. 2014-2026, vol. 29, Iss. 12, IEEE, <http://ieeexplore.ieee.org/abstract/document/5621043/>.

METHOD AND APPARATUS FOR REPAIRING MEMORY DEVICE

CROSS-REFERENCE TO RELATED APPLICATION

The present application claims priority of Korean Patent Application No. 10-2016-0179308, filed on Dec. 26, 2016, which is incorporated herein by reference in its entirety.

BACKGROUND

1. Field

Embodiments of the present disclosure relate to a semiconductor memory, and more particularly, to a method and an apparatus for repairing a semiconductor memory.

2. Description of the Related Art

Recently, development of semiconductor process technology has significantly increased the integration density of a semiconductor memory. However, such high integration density may increase the probability of an occurrence of defective memory cells, and the increase of the defective memory cells may lower a memory yield of fabricating semiconductor memories.

In order to improve the memory yield, a fail test process and a repair solution search process for memory cells may be performed. The repair solution search process may have a repair speed varying with a search method thereof. The repair speed has a large influence on a reduction of the test cost.

Most of conventional memory repair methods search for a repair solution in a single block memory. Since the single block memory has a simple spare memory architecture, the repair solution can be searched for at a relatively high speed.

However, because a multi-block memory includes various spare memories applied thereto, a repair speed in the multi-block memory is rapidly increased, and the test cost is increased. Therefore, a method of searching for a repair solution in a multi-block memory at a high speed and with high repair efficiency is desirable.

SUMMARY

Various embodiments are directed to a method and apparatus for repairing a memory device.

In an embodiment, a method for repairing a memory device comprises: collecting fail information on fail cells in a multi-block memory, the multi-block memory including a plurality of block memories; classifying the fail cells into first and second types; and repairing the fail cells in the multi-block memory using one or more of a global spare memory, a local spare memory, and a common spare memory, based on the fail information, wherein the repairing of the fail cells of the multi-block memory comprises: preferentially assigning the global spare memory to a first fail cell having the first type in a first block memory and a second fail cell having the second type in a second block memory, when a row address or a column address of the first fail cell coincides with a corresponding address of the second fail cell having the second type in the second block memory; updating the fail information according to the assignment of the global spare memory; and assigning one or both of the local spare memory and the common spare memory to remaining fail cells based on the updated fail information, the remaining fail cells being fail cells to which the global spare memory has not been assigned.

In an embodiment, an apparatus for repairing a memory device, comprises: a global repair module suitable for receiving a signal indicative of global spare memory information and outputting a signal indicative of a global repair solution; a local repair module suitable for receiving a signal indicative of local spare memory information and outputting a signal indicative of a local repair solution; a common repair module suitable for receiving a signal indicative of common spare memory information and outputting a signal indicative of a common repair solution; a final repair module suitable for combining one or more of the global repair solution, the local repair solution, and the common repair solution and outputting a final repair solution; a controller suitable for collecting fail information on fail cells in a multi-block memory, classifying the fail cells into first and second types, controlling the global repair module to preferentially assign a global spare memory to a first fail cell having the first type in a first block memory and a second fail cell having the second type in a second block memory when a row address or a column address of the first fail cell coincides with a corresponding address of the second fail cell having the second type in the second block memory, and controlling the local repair module, the common repair module, and the final repair module to assign one or both of a local spare memory and a common spare memory to remaining fail cells based on updated fail information, the remaining fail cells being fail cells to which the global spare memory has not been assigned; and a fail update module suitable for updating the fail information on the first and second types of the fail cells in the multi-block memory according to the assignment of the global spare memory.

As such, embodiments of the present disclosure are capable of searching for a repair solution at high speed in a multi-block memory having various spare memories, while having high repair efficiency.

DETAILED DESCRIPTION

Figure 1:
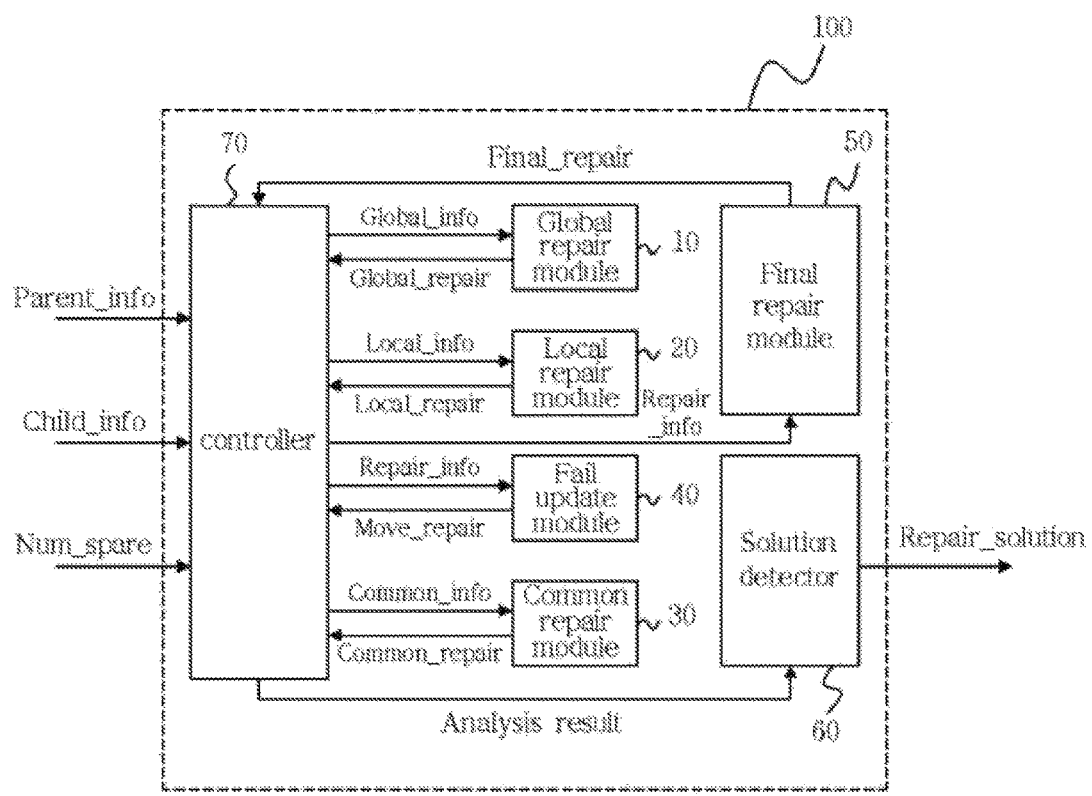
FIG. 1 is a block diagram illustrating an apparatus for repairing a memory device according to an embodiment.

Various embodiments will be described below in more detail with reference to the accompanying drawings such that this disclosure will be thorough and complete, and will fully convey the scope of the present disclosure to those skilled in the art. Throughout the disclosure, like reference numerals refer to like parts throughout the various figures and embodiments of the present disclosure.

Moreover, detailed descriptions related to publicly known functions or configurations will be ruled out in order not to unnecessarily obscure subject matters of the present disclosure.

The terms such as first and second may be used to describe various components, but the components are not limited by the terms, and the terms are used to distinguish one component from another component.

FIG. 1 is a block diagram illustrating an apparatus (hereinafter, referred to as a memory repair apparatus) 100 for repairing a memory device according to an embodiment.

Referring to FIG. 1, the memory repair apparatus 100 includes a global repair module 10, a local repair module 20, a common repair module 30, a fail update module 40, a final repair module 50, a solution detector 60, and a controller 70.

The controller 70 receives a signal Parent_info indicating fail information on a first plurality of fail cells having a first type, a signal Child_info indicating information on a second plurality of fail cells having a second type, and a signal Num_spare indicating information on spare memories. The controller 70 controls an operation of repairing the fail cells of the multi-block memory using at least one of a global spare memory, a local spare memory, and a common spare memory, according to a predetermined assignment priority of the spare memories based on the fail information. The global spare memory indicates a spare memory used for repairing fail cells which are coupled to a plurality of cell lines, each of the cell lines being coupled to a plurality of fail cells having the same address (e.g., the same row address or the same column address) in the multi-block memory. The local spare memory indicates a spare memory used for repairing fail cells which occurred in a corresponding memory block. The common spare memory indicates a spare memory used for repairing fail cells which occurred in memory blocks disposed adjacent to the spare memory.

The fail information may include a number of fail cells for each block memory in the multi-block memory. The fail information may include information whether each of the fail cells has the first type or the second type, depending on whether a row address or a column address of a fail cell coincides with a corresponding address of another fail cell. The signal Parent_info may indicate that a row address and a column address of a currently input fail cell are different from a row address and a column address of a previously input fail cell, respectively. The signal Child_info may indicate that a row address of a currently input fail cell coincides with a row address of a previously input fail cell, or a column address of the currently input fail cell coincides with a column address of the previously input fail cell.

The global repair module 10 receives a signal Global_info indicating global spare memory information from the controller 70 and generates a signal Global_repair indicating a global repair solution.

The local repair module 20 receives a signal Local_info indicating local spare memory information from the controller 70 and generates a signal indicating Local_repair a local repair solution. The common repair module 30 receives a signal Common_info indicating common spare memory information from the controller 70 and generates a signal Common_repair indicating a common repair solution. The controller 70 receives the signals Global_repair, Local_repair, and Common_repair respectively indicating the global repair solution, the local repair solution, and the common repair solution.

When an address of a fail cell having the first type in a specific block memory coincides with a corresponding address of a fail cell having the second type in another block memory, the controller 70 determines that these fail cells satisfy a global spare memory assignment condition and may control the global repair module 10 to preferentially assign a global spare memory to the fail cells. The controller 70 controls the local repair module 20 and the common repair module 30 to assign at least one of the local spare memory and the common spare memory, based on fail information updated by the fail update module 40.

When the fail update module 40 receives a signal Repair_info indicating repair information from the controller 70, the fail update module 40 reclassifies fail cells having the first type and the second type in each of the block memories. For example, when a fail cell having the first type in a first block memory has the same column address or the same row address as a fail cell having the second type in a second block memory to which no global spare memory has been assigned, the fail update module 40 may convert the second type of the fail cell in the second block memory to the first type or maintain the second type of the fail cell in the second block memory, as will be described below in more detail with reference to FIG. 2.

The final repair module 50 combines the global repair solution, the local repair solution, and the common repair solution, and provides a signal Final_repair indicating a final solution capable of repairing all of the remaining fail cells to the controller 70.

The solution detector 60 receives a signal Analysis result indicating an analysis result from the controller 70, and outputs a signal Repair_solution indicating a repair solution or a signal indicating that the multi-block memory cannot be repaired, depending on whether the multi-block memory can be repaired.

The memory repair apparatus 100 according to the embodiment of FIG. 1 classifies fails cells in the multi-block memory into the first and second types, preferentially assigns one or more global spare memories according to the predetermined assignment priority of the spare memories, based on the fail information, reclassifies the types of the fail cells, and repairs the fail cells of the multi-block memory by assigning the local and common spare memories in order of the local spare memory and the common repair memory.

For example, after the controller 70 controls the global repair module 10 to preferentially assign the global spare memory, the controller 70 controls the local repair module 20 and the common repair module 30 to assign at least one of the local spare memory and the common spare memory, based on the fail information updated by the fail update module 40.

The controller 70 controls the final repair module 50 to repair all the fail cells of the multi-block memory using a combination of the global repair solution, the local repair solution, and the common repair solution.

In an embodiment, one or more of the global repair module 10, the local repair module 20, the common repair module 30, the fail update module 40, the final repair module 50, and the solution detector 60 are implemented in one or more processors (not shown) executing computer programming instructions from a non-transitory computer-readable medium.

Figure 2:
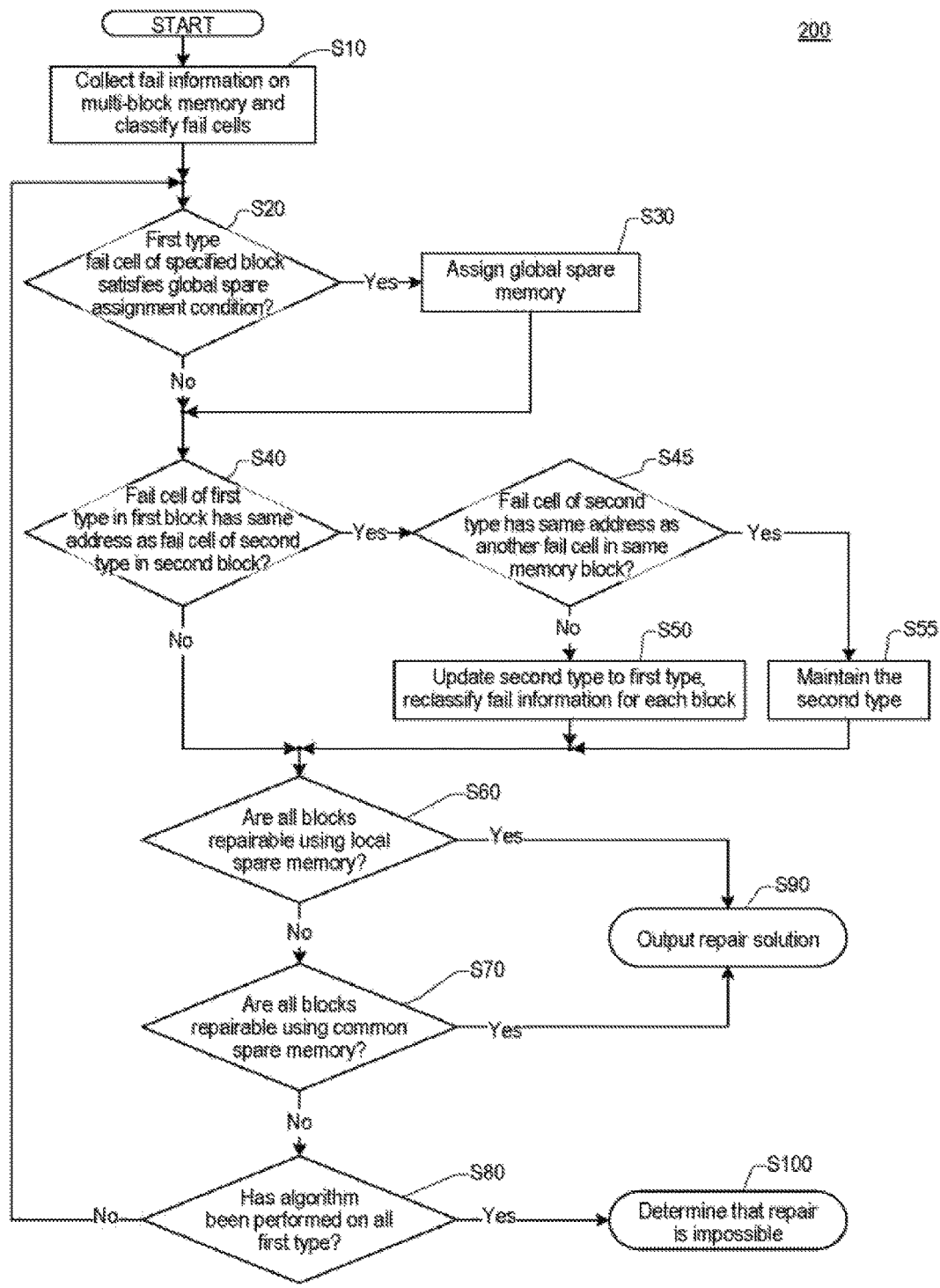
FIG. 2 is a flowchart illustrating a method of repairing a memory device according to an embodiment.

FIG. 2 is a flowchart illustrating a method 200 of repairing a memory device (hereafter, referred to as a memory repair method) according to an embodiment.

Referring to FIG. 2, the memory repair method 200 is started at step S10 where the controller 70 collects fail information on fail cells in a multi-block memory including a plurality of block memories. When collecting the fail information, the controller 70 counts a number of fail cells in each of the block memories, and classifies the fail cells into first and second types depending on whether addresses of the fail cells coincide between the block memories or within a block memory.

The controller 70 compares the addresses of one or more previously input fail cells to the address of a currently input fail cell.

When the addresses do not coincide with each other, the controller 70 classifies the currently input fail cell into the first type. However, when the addresses coincide with each other, the controller 70 classifies the currently input fail cell into the second type. At this time, the currently input fail cell is classified into the first type when a row address and a column address of the currently input fail cell do not respectively coincide with a row address or a column address of any of the previously input fail cells. The currently input fail cell is classified into the second type when the row address of the currently input fail cell coincides with the row address of one or more previously input fail cells or the column address of the currently input fail cell coincides with the column address of one or more previously input fail cells.

Figure 3:
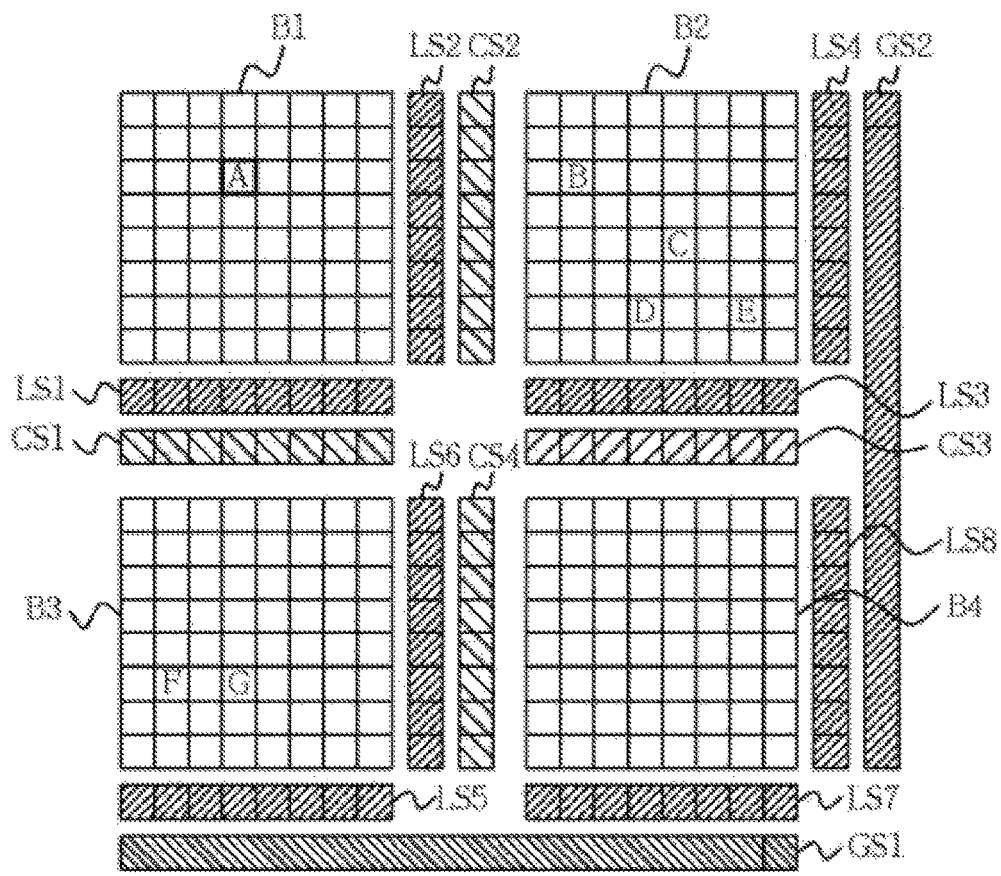
FIG. 3 illustrates an exemplary method of repairing a memory device.

FIG. 3 illustrates a plurality of block memories B1, B2, B3, and B4 and examples of fail cells A, B, C, D, E, F, and G. Referring to FIGS. 2 and 3, at step S10, a controller (e.g., the controller 70 of FIG. 1) receives fail information on the fail cell A of the first fail in the first block memory B1. Then, the collector receives fail information on the fail cells B, C, D, and E of the second block memory B2 and classifies each of the fail cells B, C, D, and E into the first type or the second type. For example, because the fail cell B in the second block memory B2 has the same row address as the fail cell A in the first block memory B1, the controller classifies the fail cell B into the second type. Because the fail cell C in the second block memory B2 has different column and row addresses from those of the fail cells A and B, the controller classifies the fail cell C into the first type. Similarly, the controller classifies the fail cell D into the first type and the fail cell E into the second type. These processes may repeat until the controller performs the collection and the classification operations on all the block memories B1, B2, B3, and B4. As a result, the controller classifies the fail cells F and G in the third block memory B3 into the first type and the second type, respectively.

Referring back to FIG. 2, at step S20, the controller checks whether a global spare memory assignment condition is satisfied.

Specifically, the global spare memory assignment condition is satisfied when an address (e.g., a column address or a row address) of fail cells having the first type in a specific block memory coincides with a corresponding address of fail cells having the second type in another block memory, based on the fail information on the first and second types of the fail cells.

For example, referring to FIG. 3, the fail cell A having the first type in the first block memory B1 has the same row address as that of the cell B having the second type in the second block memory B2, and the cell A in the first block memory B1 has the same column address as that the cell G having the second type in the third block memory B3. As a result, the controller may determine that the fail cells A, B, and fail cells A, G satisfy the global spare memory assignment condition.

Referring back to FIG. 2, at step S30, when the global spare memory assignment condition is satisfied, the controller controls a global repair module (e.g., the global repair module 10 of FIG. 1) to preferentially assign a global spare memory to at least some of the fail cells that have been determined to satisfy the global spare memory assignment condition.

When a plurality of block memories include fail cells that satisfy the global spare memory assignment, the controller may preferentially select a block memory including a larger number of fail cells, among the plurality of block memories. For example, referring to FIG. 3, the second block memory B2 includes four fail cells B, C, D, and E and the third block memory B3 includes two fail cells F and G. As a result, the controller selects the second block memory B2 and assigns a first global spare memory GS1 to the fail cell B in the second block memory B2 and the fail cell A in the first block memory B1, among the fail cells A, B, and fail cells A, G that have been determined to satisfy the global spare memory assignment condition. Specifically, memory cells in the first global spare memory GS1 may replace the fail cell B in the second block memory B2 and the fail cell A in the first block memory B1.

Referring to FIG. 2, at step S40, the controller determines whether a fail cell having a first type in a first block memory has the same column or row address as a fail cell having a second type in a second block memory to which no global spare memory is assigned.

For example, referring to FIG. 3, after assigning the first global spare memory GS1 to the fail cells A and B, the controller determines that the fail cell A of the first type in the first block memory B1 has the same column address as the fail cell G of the second type in the third block memory B3, to which the first global spare memory GS1 has not been assigned.

Referring to FIG. 2, if the controller determines that the fail cell of the first type in the first block memory has the same column address or the same row address as the fail cell of the second type in the second block memory to which no global spare memory is assigned, the method 200 proceeds to step S45. Otherwise, the method 200 proceeds to step S60.

Referring to FIG. 2, at step S45, the controller determines whether the fail cell of the second type in the second block memory has the same column address or the same row address as another fail cell in the second block memory. For example, referring to FIG. 3, the controller determines that the fail cell G of the second type in the third block memory B3 has the same row address as the fail cell F of the first type in the third block memory B3. In this case, the method 200 proceeds to step S55, and the controller maintains the second type of the fail cell G.

At step S50, the controller controls a fail update module (e.g., the fail update module 40 of FIG. 1) to update the type of the fail cell in the second block memory. Specifically, the controller converts the second type of the fail cell in the second block memory into the first type. For example, although not shown in FIG. 3, in the absence of the fail cell F in the third block memory B3, the controller reclassifies the fail cell G of the second type in the third block memory B3 into the first type.

Referring to FIG. 2, at step S60, the controller 70 determines whether all of the remaining fail cells after assigning the global spare memory can be repaired using a plurality of local spare memories, based on the updated fail information. When the remaining fail cells can be repaired using the local spare memories, the controller controls a solution detector (e.g., the solution detector 60 of FIG. 1) to output a signal indicating a repair solution at step S90. The controller may preferentially assign one or more local spare memories to fail cells having the second type. In addition, the controller may preferentially assign a local spare memory to fails cells having the same row address or the same column address in the same block memory. For example, referring to FIG. 3, because the fail cells D and E in the second block memory B2 have the same row address, the controller may preferentially assign a local spare memory LS3 to the fail cells D and E. Then, the controller may assign another local spare memory LS4 to the remaining fail cell C in the second block memory B2.

When one or more fail cells remain unrepaired after assigning the local spare memories, the controller determines whether all of the remaining fail cells can be repaired using one or more common spare memories, at step S70. When all of the remaining fail cells can be repaired using the one or more common spare memories, the controller controls the solution detector to output the signal indicating the repair solution at step 90. The controller may preferentially assign a common spare memory to a block memory based on a number of the remaining fail cells in the block memory. For example, the controller may preferentially assign the common spare memory to a block memory having the largest number of the remaining fail cells.

Then, when one or more of fail cells remain unrepaired after assigning the common repair memories, the controller determines whether the repair operation has been performed on all of the fail cells having the first type, at step S80. When the controller determines that there is one or more fail cells having the first type on which the repair operation has not been performed, the method 200 returns to the step S20 to check whether the one or more fail cells having the first type satisfy the global spare memory assignment condition.

When one or more fail cells remain unrepaired even though the above-described method has been performed on all of the fail cells having the first type, the controller outputs a signal indicating that the multi-block memory cannot be repaired, at step S100.

When the fail information collection result indicates that the multi-block memory includes a block memory without having any fail cell, the controller may switch a common spare memory of the block memory to a local spare memory of another block memory adjacent thereto. For example, referring to FIG. 3, because the fourth block memory B4 has does not have any fail cell, two common spare memories CS3 and CS4 which can be used for the fourth block memory B4 are switched to local spare memories which can be used for the second and third block memories B2 and B3, respectively.

Because the block memory having no fail cells does not need to utilize replacement spare cells in the common spare memory, the replacement spare cells are used for another block memory adjacent thereto. At this time, the controller may sequentially repair block memories from a block memory having the largest number of fail cells, using replacement spare cells in the common spare memory.

When a global spare memory is not assigned, the global spare memory is used to repair fail cells having the first type present in the multi-block memory. Through the above-described method, all of the spare memories may be assigned to corresponding lines of fail cells, in order to repair the fail cells of the multi-block memory.

As such, when it is determined that all the fail cells of the multi-block memory can be repaired, a repair solution is output. Otherwise, a signal indicating that the multi-block memory cannot be repaired is output, and the method is complete.

According to the above-described embodiments, a repair process is performed according to a specific order of assigning different types of spare memories, for example, in the order of assigning a global spare memory, a local spare memory, and a common spare memory. As a result, the memory repair apparatus and method can be faster and more effective than a conventional total inspection method for a multi-block memory. Therefore, the memory repair apparatus and method can reduce the test cost through the high repair speed in the multi-block memory, and effectively repair fail cells in the multi-block memory.

As such, the memory repair method and apparatus according to the above-described embodiments can be applied to multi-block memories having various spare memory architectures, and improve the repair efficiency of semiconductor memories.

Since the memory repair method and apparatus performs searching only when the repair possibility is high, the number of search cases can be significantly reduced. Thus, the repair time can be decreased to thereby reduce the test cost in the memory repair environment.

Therefore, the memory repair method and apparatus are suitable for repairing a multi-block memory, and have a high repair speed.

Although various embodiments have been described for illustrative purposes, it will be apparent to those skilled in the art that various updates and modifications may be possible.

What is claimed is:

1. A method for repairing a memory device comprising:
   collecting fail information on fail cells in a multi-block memory, the multi-block memory including a plurality of block memories;
   classifying the fail cells into first and second types; and
   repairing the fail cells in the multi-block memory using one or more of a global spare memory, a local spare memory, and a common spare memory, based on the fail information,
   wherein the repairing of the fail cells of the multi-block memory comprises:
      preferentially assigning the global spare memory to a first fail cell having the first type in a first block memory and a second fail cell having the second type in a second block memory, when a row address or a column address of the first fail cell coincides with a corresponding address of the second fail cell having the second type in the second block memory;
      updating the fail information according to the assignment of the global spare memory; and
      assigning one or both of the local spare memory and the common spare memory to remaining fail cells based on the updated fail information, the remaining fail cells being fail cells to which the global spare memory has not been assigned.

2. The method of claim 1, wherein the collecting of the fail information comprises counting a number of fail cells in each of the block memories, and
   wherein classifying the fail cells into the first and second types comprises determining whether a row address or a column address of the fail cells coincides between the block memories or within a block memory.

3. The method of claim 1, wherein the assigning of the global spare memory comprises preferentially selecting the second fail cell in the second block memory over a third fail cell having the second type in a third block memory, the second block memory having a number of fail cells more than the third block memory, when the row address or the column address of the first fail cell in the first block memory coincides with a corresponding address of the third fail cell in the third block memory.

4. The method of claim 1, wherein the updating of the fail information comprises converting a third fail cell having the second type in a third block memory into the first type, when the row address or the column address of the first fail cell in the first block memory coincides with a corresponding address of the third fail cell in the third block memory and the third fail cell has different row and column addresses from other fail cells in the third block memory.

5. The method of claim 1, wherein the local spare memory is preferentially assigned to fail cells having the second type in a block memory corresponding to the local spare memory.

6. The method of claim 1, wherein the common spare memory is preferentially assigned to fail cells in a block memory having a largest number of the remaining fail cells.

7. The method of claim 1, wherein the common spare memory is a first common spare memory and the local spare memory is a first local spare memory, the method further comprising switching a second common spare memory disposed adjacent to a third block memory and a fourth block memory into a second local spare memory of the third block memory, when the fail information collection result indicates that the fourth block memory has no fail cell.

8. The method of claim 1, wherein classifying the fail cells into the first and second types comprises:
   comparing an address of a previously input fail cell to an address of a currently input fail cell;
   classifying the currently input fail cell into the first type when a row address and a column address of the currently input fail cell are different from a row address and a column address of the previously input fail cell; and
   classifying the currently input fail cell into the second type when the row address of the currently input fail cell coincides with the row address of the previously input fail cell or the column address of the currently input fail cell coincides with the column address of the previously input fail cell.

9. An apparatus for repairing a memory device, comprising:
   a global repair module suitable for receiving a signal indicative of global spare memory information and outputting a signal indicative of a global repair solution;
   a local repair module suitable for receiving a signal indicative of local spare memory information and outputting a signal indicative of a local repair solution;
   a common repair module suitable for receiving a signal indicative of common spare memory information and outputting a signal indicative of a common repair solution;
   a final repair module suitable for combining one or more of the global repair solution, the local repair solution, and the common repair solution and outputting a final repair solution;
   a controller suitable for collecting fail information on fail cells in a multi-block memory, classifying the fail cells into first and second types, controlling the global repair module to preferentially assign a global spare memory to a first fail cell having the first type in a first block memory and a second fail cell having the second type in a second block memory when a row address or a column address of the first fail cell coincides with a corresponding address of the second fail cell having the second type in the second block memory, and controlling the local repair module, the common repair module, and the final repair module to assign one or both of a local spare memory and a common spare memory to remaining fail cells based on a updated fail information, the remaining fail cells being fail cells to which the global spare memory has not been assigned; and
   a fail update module suitable for updating the fail information on the first and second types of the fail cells in the multi-block memory according to the assignment of the global spare memory.

10. The apparatus of claim 9, wherein when the row address or the column address of the first fail cell in the first block memory coincides with a corresponding address of a third fail cell in a third block memory, the controller preferentially selects the second fail cell in the second block memory over the third fail cell in the third block memory, the second block memory having a number of fail cells more than the third block memory.

11. The apparatus of claim 9, wherein when the row address or the column address of the first fail cell in the first block memory coincides with a corresponding address of a third fail cell having the second type in a third block memory to which no global spare memory has been assigned and the third fail cell has different row and column addresses from other fail cells in the third block memory, the controller controls the fail update module to convert the second type of the third fail cell into the first type.

12. The apparatus of claim 9, wherein the controller controls the local repair module to preferentially assign the local spare memory to fail cells having the second type in a block memory corresponding to the local spare memory.

13. The apparatus of claim 9, wherein the controller controls the common repair module to preferentially assign the common spare memory to fail cells in a block memory having a largest number of the remaining fail cells.

14. The apparatus of claim 9, wherein the common spare memory is a first common spare memory and the local spare memory is a first local spare memory, and
   wherein the controller switches a second common spare memory disposed adjacent to a third block memory and a fourth block memory into a second local spare memory of the third block memory, when the fail information collection result indicates that the fourth block memory has no fail cell.

15. The apparatus of claim 9, further comprising a solution detector suitable for receiving an analysis result from the controller and outputting a repair solution or a signal indicative of irreparability of the fail cells in the multi-block memory.

* * * * *